(12) United States Patent
Hayasaki

(10) Patent No.: US 11,668,754 B2
(45) Date of Patent: Jun. 6, 2023

(54) BATTERY DEVICE THAT PROVIDES A NOTIFICATION RELATING TO A REMAINING CHARGE CAPACITY, AND CONTROL METHOD THEREOF

(71) Applicant: CANON KABUSHIKI KAISHA, Tokyo (JP)

(72) Inventor: Hiromi Hayasaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 17/149,330

(22) Filed: Jan. 14, 2021

(65) Prior Publication Data

US 2021/0223318 A1    Jul. 22, 2021

(30) Foreign Application Priority Data

Jan. 21, 2020    (JP) .............................. JP2020-007860

(51) Int. Cl.
| | | |
|---|---|---|
| *G01R 31/36* | (2020.01) | |
| *H02J 7/00* | (2006.01) | |
| *H01M 10/46* | (2006.01) | |
| *G03B 7/26* | (2021.01) | |

(52) U.S. Cl.
CPC .......... *G01R 31/3644* (2013.01); *G03B 7/26* (2013.01); *H01M 10/46* (2013.01); *H02J 7/0047* (2013.01)

(58) Field of Classification Search
CPC ...... H02J 7/0047; H02J 7/0048; H02J 7/0044; H02J 7/00032; H02J 7/00034; H02J 7/00036; G01R 31/3644; G01R 31/36; G01R 31/382; G01R 31/385; G01R 31/387; H01M 10/46
USPC .......................................................... 320/137
See application file for complete search history.

(56) References Cited

U.S. PATENT DOCUMENTS

| | | | |
|---|---|---|---|
| 9,431,842 B1* | 8/2016 | Noble, Jr. ........... | H02J 7/00712 |
| 2020/0077699 A1* | 3/2020 | Bagai ..................... | A24F 40/00 |

FOREIGN PATENT DOCUMENTS

| | | |
|---|---|---|
| JP | H09113951 A | 5/1997 |
| JP | 5717308 B2 | 5/2015 |

* cited by examiner

*Primary Examiner* — Nathaniel R Pelton
(74) *Attorney, Agent, or Firm* — Canon U.S.A., Inc. IP Division

(57) ABSTRACT

A battery device includes a connection unit to which an electronic apparatus is connected, a calculation unit that calculates a remaining battery level of a battery of the battery device based on a full charge capacity of a battery of the electronic apparatus, and a display unit that displays information indicating a result of calculation made by the calculation unit.

12 Claims, 8 Drawing Sheets

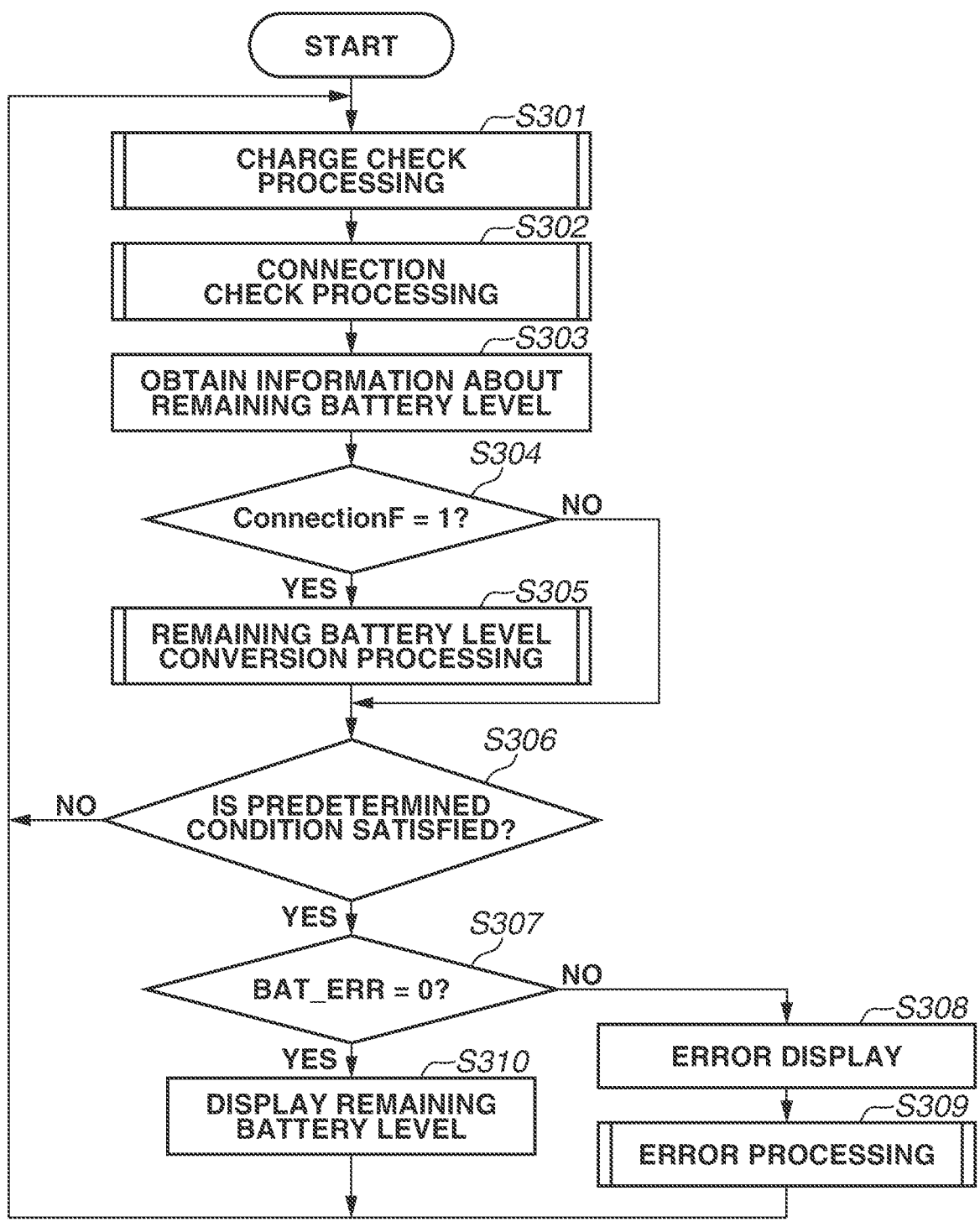

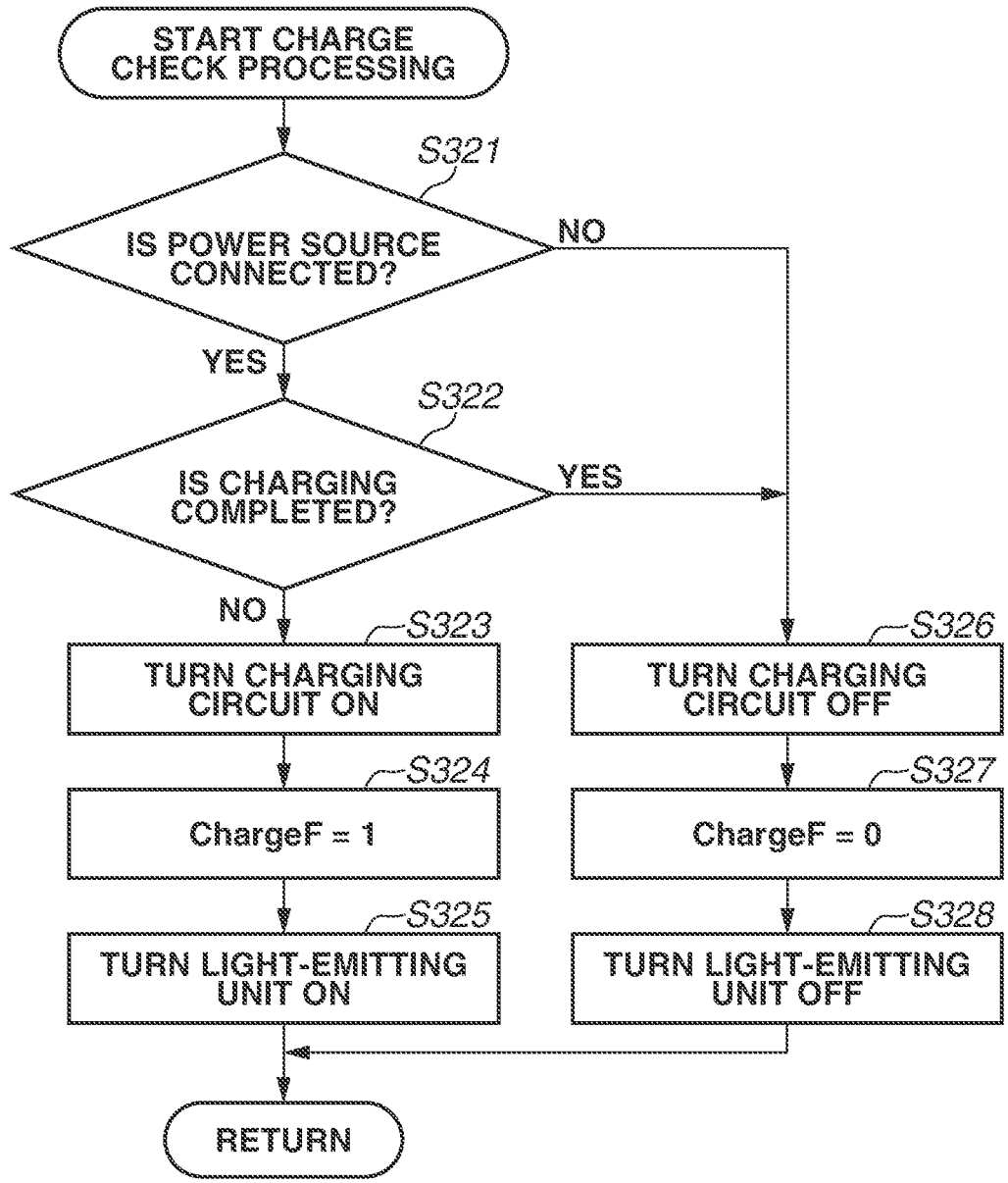

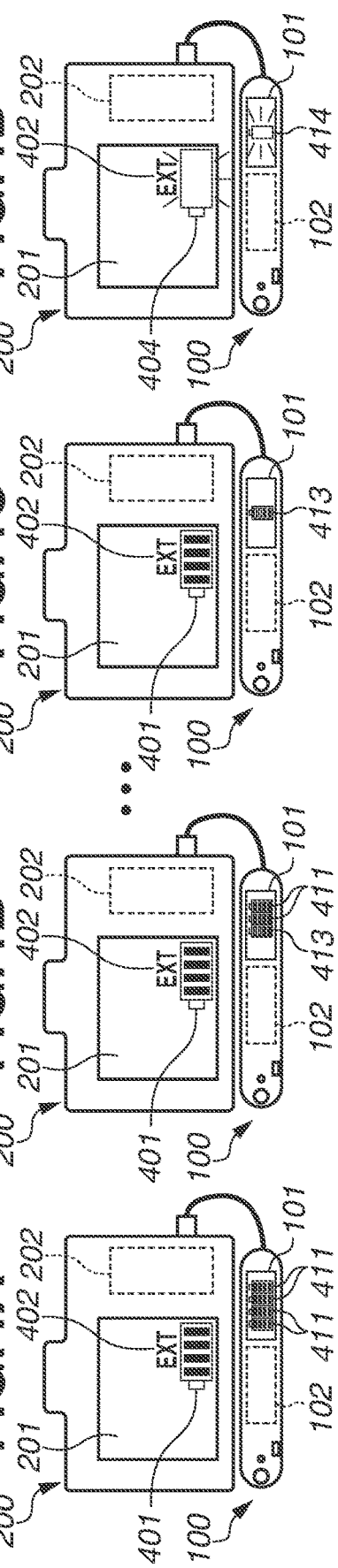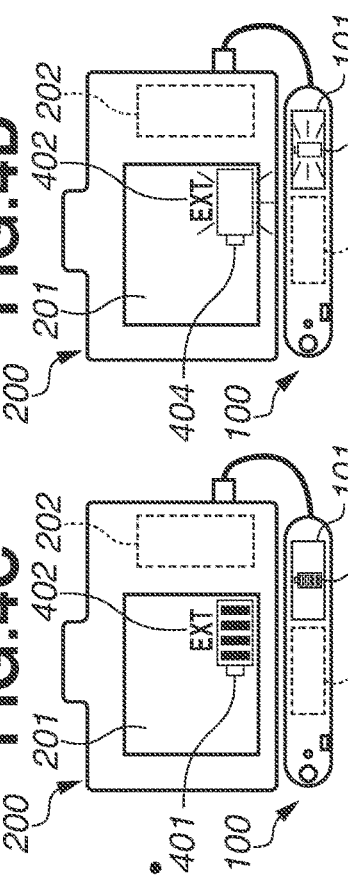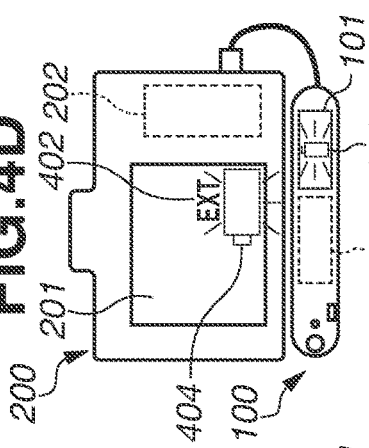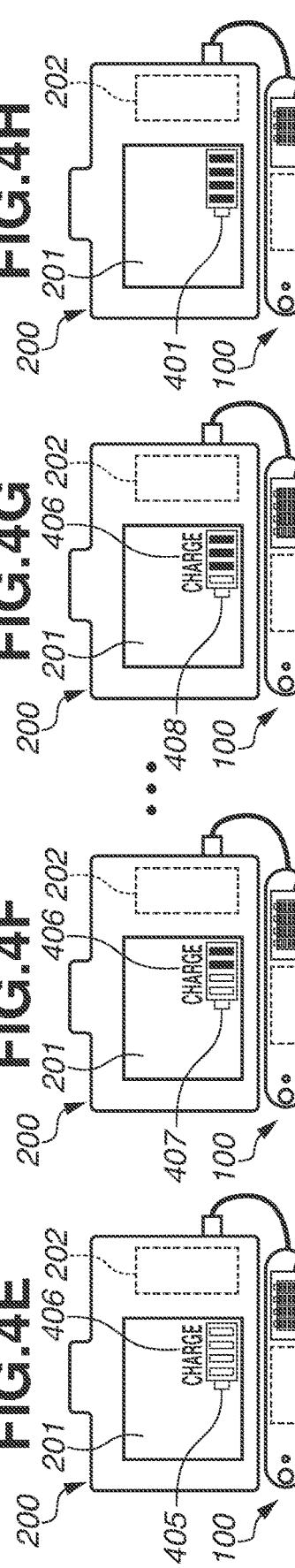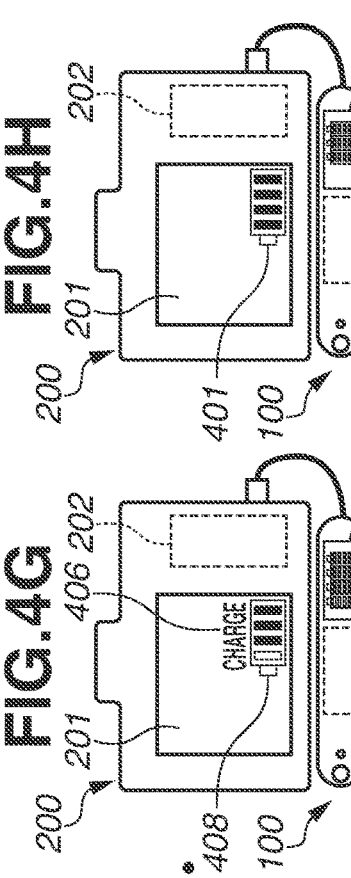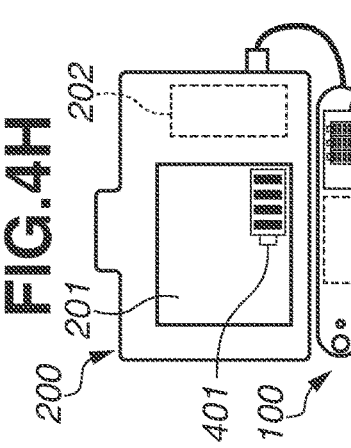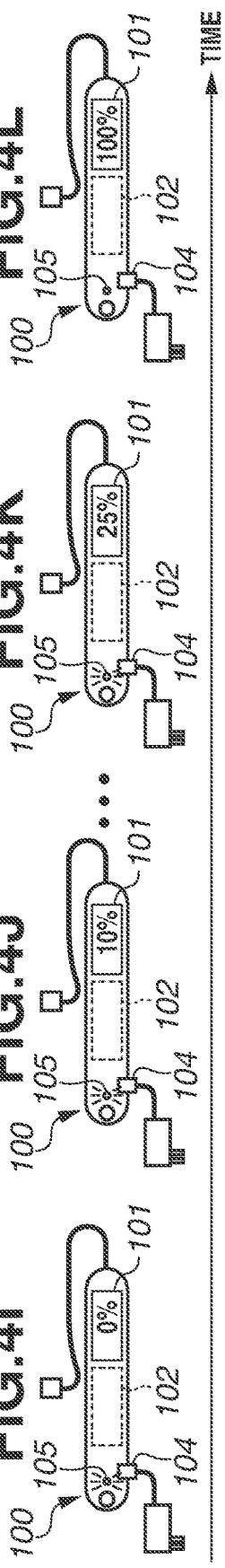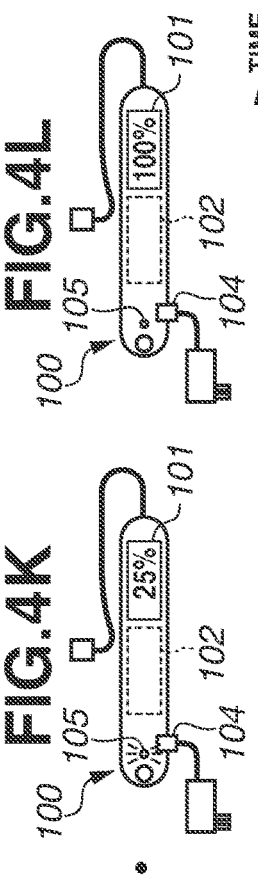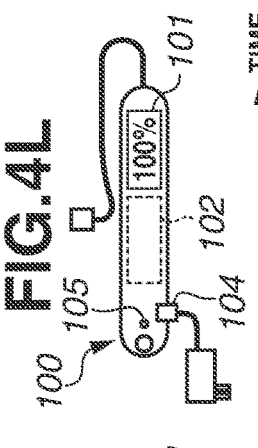

BATTERY DEVICE THAT PROVIDES A NOTIFICATION RELATING TO A REMAINING CHARGE CAPACITY, AND CONTROL METHOD THEREOF

BACKGROUND

Field of the Disclosure

Aspects of the disclosure generally relate to a battery device and a control method thereof.

Description of the Related Art

Japanese Patent Application Laid-Open No. 09-113951 discusses a camera including a main battery and an auxiliary battery for charging the main battery.

In the camera discussed in Japanese Patent Application Laid-Open No. 09-113951, however, it is impossible for a user to know the remaining battery level of the auxiliary battery in terms of to what extent the main battery can be charged. The camera discussed in Japanese Patent Application Laid-Open No. 09-113951 is unable to notify the user of the relationship between the full charge capacity of the main battery and the remaining battery level of the auxiliary battery, either.

SUMMARY

According to an aspect of the embodiments, a relationship between the full charge capacity of a battery of an electronic apparatus and the remaining battery level of a battery of a battery device connected to the electronic apparatus can be notified to the user in an easily understandable manner.

According to an aspect of the embodiments, there is provided a battery device including a connection unit to which an electronic apparatus is connected, a calculation unit configured to calculate a remaining battery level of a battery of the battery device based on a full charge capacity of a battery of the electronic apparatus, and a display unit configured to display information indicating a result of calculation made by the calculation unit.

According to an aspect of the embodiments, there is provided a method including calculating by a calculation unit of a battery device a remaining battery level of a battery of the battery device based on a full charge capacity of a battery of an electronic apparatus connected to a connection unit of the battery device, and displaying information indicating a result of calculation made by the calculation unit on a display unit of the battery device.

According to an aspect of the embodiments, there is provided a non-transitory storage medium that stores a program for causing a computer to execute a method including calculating by a calculation unit of a battery device a remaining battery level of a battery of the battery device based on a full charge capacity of a battery of an electronic apparatus connected to a connection unit of the battery device, and displaying information indicating a result of calculation made by the calculation unit on a display unit of the battery device.

Further aspects of the embodiments will become apparent from the following embodiments.

BRIEF DESCRIPTION OF THE DRAWINGS

FIGS. 3A to 3D are flowcharts illustrating an example of remaining battery level display processing.

FIGS. 4A to 4L are diagrams illustrating examples of a display mode of a remaining battery level of a battery.

DESCRIPTION OF THE EMBODIMENTS

Exemplary embodiments, features, and aspects of the disclosure will be described below with reference to the drawings. However, aspects of the disclosure are not limited to the following embodiments.

Figure 1:
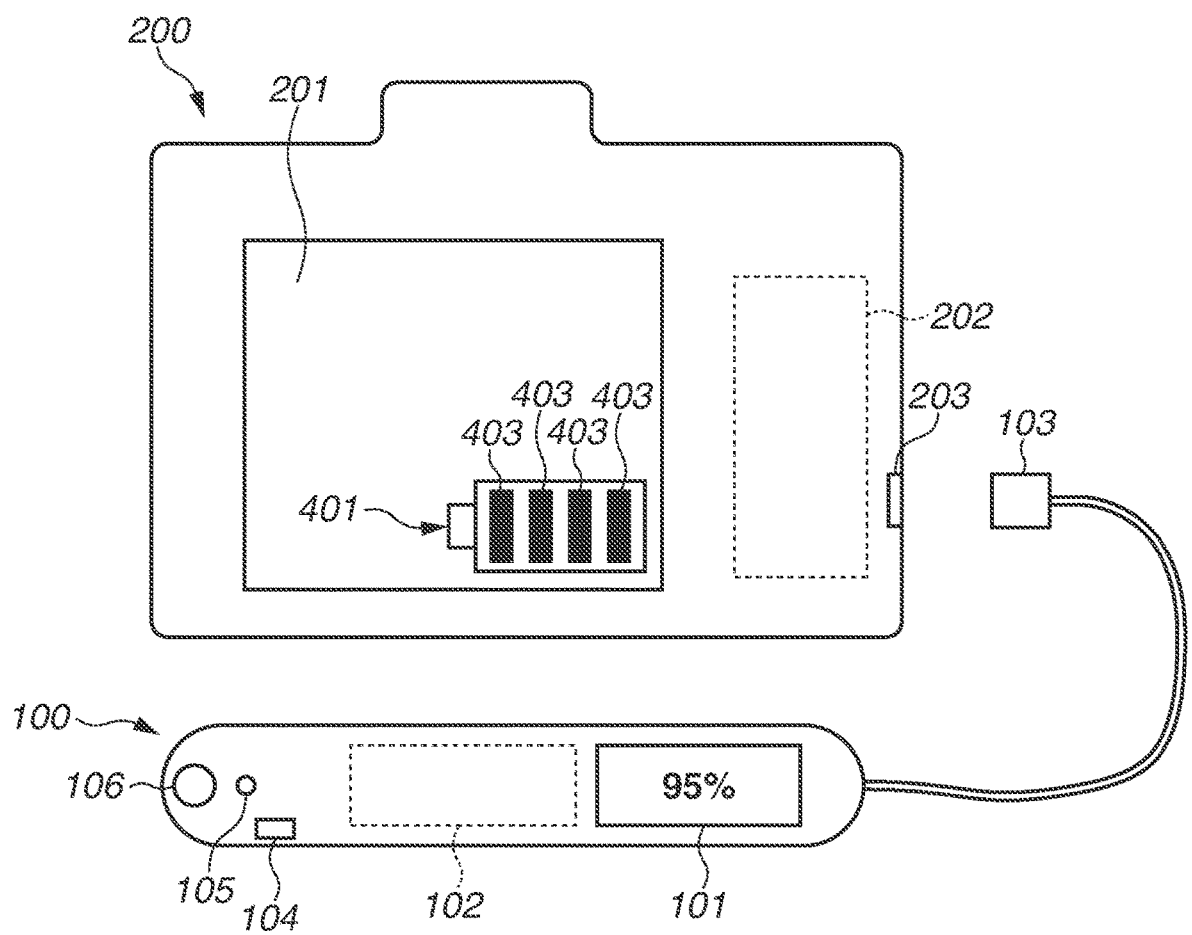
FIG. 1 is a diagram illustrating an example of appearance of a battery device and an electronic apparatus.

A first exemplary embodiment will be described below. FIG. 1 is a diagram illustrating an example of appearance of a battery device 100 and an electronic apparatus 200.

The battery device 100 is a device for supplying power to the electronic apparatus 200. For example, the battery device 100 is a device operating as a mobile battery. The battery device 100 includes a display unit 101, a battery 102, a connector 103, a connector 104, a light-emitting unit 105, and a power switch 106, for example.

The display unit 101 displays battery information (e.g., a remaining battery level) about the battery 102. The battery 102 functions as a power supply of the electronic apparatus 200. An example of the battery 102 is a lithium ion battery.

The connector 103 is a connector for connecting to the electronic apparatus 200. Connecting the electronic apparatus 200 to the connector 103 starts power supply from the battery device 100 to the electronic apparatus 200. The connector 104 is a connector for connecting to a power source. Connecting a power source to the connector 104 starts charging of the battery 102.

The light-emitting unit 105 can display a charging state of the battery 102. For example, the light-emitting unit 105 is lit when the battery 102 starts to be charged. The light-emitting unit 105 is lit off when the charging of the battery 102 is completed. The light-emitting unit 105 includes a light-emitting diode (LED), for example. The power switch 106 is a switch for activating the battery device 100. When the battery device 100 is activated by the power switch 106, the battery information (such as remaining battery level) about the battery 102 is displayed on the display unit 101.

The electronic apparatus 200 is an apparatus that operates on power supplied from the battery device 100, and charges a battery 202 thereof with the power supplied from the battery device 100. For example, the electronic apparatus 200 is an apparatus operating as a digital camera. The electronic apparatus 200 includes a display unit 201, the battery 202, and a connector 203, for example.

The display unit 201 can display battery information (e.g., a remaining battery level) about the battery 202. FIG. 1 illustrates an example where the display unit 201 displays the remaining battery level of the battery 202 by using a battery image 401. The display unit 201 can display a state of connection with another device.

The battery 202 is a power supply of the electronic apparatus 200, and supplies power to the components of the electronic apparatus 200. The battery 202 may be built in the electronic apparatus 200 or removable from the electronic apparatus 200. For example, a lithium ion battery can be used as the battery 202. The connector 203 is a connector for connecting the electronic apparatus 200 to the battery device 100.

Figure 2:
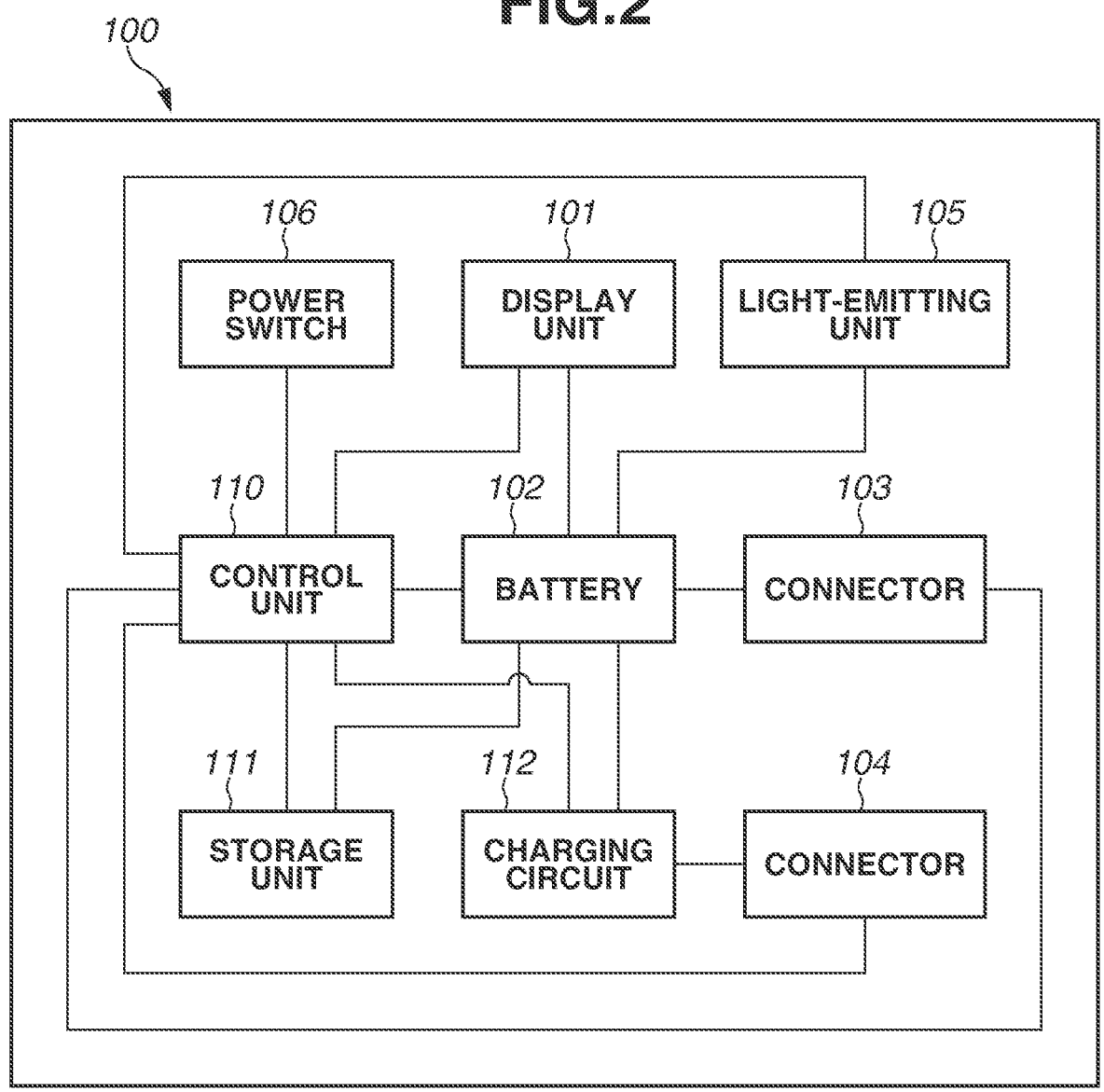
FIG. 2 is a block diagram illustrating components of the battery device.

Next, the components of the battery device 100 will be described with reference to FIG. 2. The components illustrated in FIG. 1 are designated by the same reference numerals, and a description thereof will be omitted.

The battery device 100 includes a control unit 110, a storage unit 111, and a charging circuit 112, for example.

The control unit 110 controls operation of the battery device 100 by controlling the components of the battery device 100. The control unit 110 also controls display of the remaining battery level of the battery 102 by controlling the display unit 101. The control unit 110 also performs processing of the flowcharts of FIGS. 3A to 3D to be described below by executing a program stored in the storage unit 111. The storage unit 111 stores the program to be executed by the control unit 110, and information that the control unit 110 uses in performing processing. The storage unit 111 is also used as a working memory when the control unit 110 performs various types of processing.

The charging circuit 112 charges the battery 102 if a power source is connected to the connector 104. The start and stop of charging by the charging circuit 112 are controlled by the control unit 110.

Next, an example of remaining battery level display processing will be described with reference to the flowchart of FIG. 3A. The flowchart of FIG. 3A is implemented by the control unit 110 executing the program stored in the storage unit 111.

In step S301, the control unit 110 performs charge check processing.

FIG. 3B is a flowchart illustrating an example of the charge check processing performed in step S301.

In step S321, the control unit 110 determines whether a power source for charging the battery 102 is connected to the connector 104. If the control unit 110 determines that the power source is connected to the connector 104 (YES in step S321), the processing proceeds to step S322. If the control unit 110 determines that no power source is connected to the connector 104 (NO in step S321), the processing proceeds to step S326.

In step S322, the control unit 110 checks the charging state of the battery 102. If the charging is already completed (YES in step S322), the processing proceeds to step S326. If the charging is not completed (NO in step S322), the processing proceeds to step S323.

In step S323, the control unit 110 turns the charging circuit 112 on to start charging the battery 102 with the power source. If the charging circuit 112 is already on, the control unit 110 maintains the charging circuit 112 on.

In step S324, the control unit 110 stores information indicating that the battery 102 is being charged with the power source in the storage unit 111. For example, the control unit 110 sets the value of a charging state flag ChargeF to "1" and stores the value of ChargeF in the storage unit 111. If ChargeF is already 1, the control unit 110 continues to store "1" such that ChargeF=1.

In step S325, the control unit 110 causes the light-emitting unit 105 to be lit. If the light-emitting unit 105 is already lit, the control unit 110 maintains the light-emitting unit 105 lit. Causing the light-emitting unit 105 to be lit allows the user to find out that the battery 102 is being charged with the power source.

In step S326, the control unit 110 turns the charging circuit 112 off to stop charging the battery 102 with the power source. If the charging circuit 112 is already off, the control unit 110 maintains the charging circuit 112 off.

In step S327, the control unit 110 stores information indicating that the battery 102 is not being charged with a power source in the storage unit 111. For example, the control unit 110 sets the value of the charging state flag ChargeF to "0" and stores the value of ChargeF in the storage unit 111. If ChargeF is already 0, the control unit 110 continues to store "0" such that ChargeF=0.

In step S328, the control unit 110 causes the light-emitting unit 105 to be unlit. If the light-emitting unit 105 is already off, the control unit 110 maintains the light-emitting unit 105 off. Causing the light-emitting unit 105 to be unlit allows the user to find out that the charging of the battery 102 with a power source is stopped.

After the processing of the foregoing step S325 or S328 is ended, the processing proceeds to step S302 of FIG. 3A.

In step S302, the control unit 110 performs connection check processing.

Figure 3C:
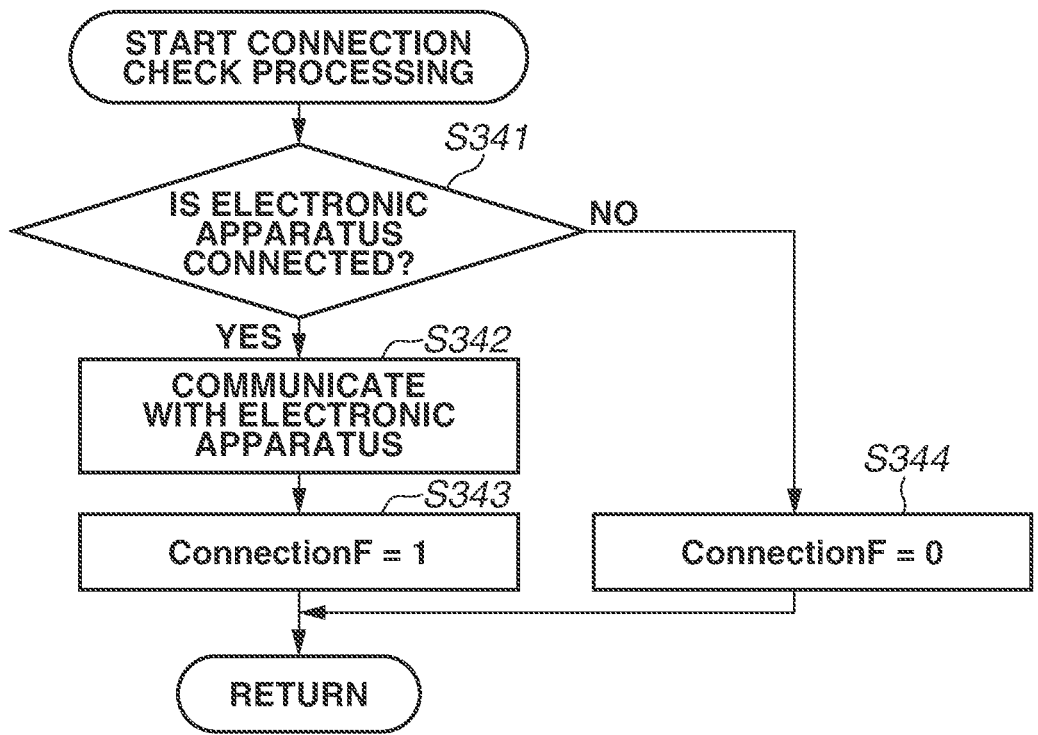

FIG. 3C is a flowchart illustrating an example of the control check processing performed in step S302.

In step S341, the control unit 110 determines whether the electronic apparatus 200 is connected to the connector 103. If the electronic apparatus 200 is determined to be connected to the connector 103 (YES in step S341), the processing proceeds to step S342. If the electronic apparatus 200 is determined to be not connected to the connector 103 (NO in step S341), the processing proceeds to step S344.

In step S342, the control unit 110 communicates with the electronic apparatus 200 to obtain battery information about the electronic apparatus 200, and stores the obtained battery information in the storage unit 111. In the first exemplary embodiment, the control unit 110 obtains the battery information about the battery 202 from the electronic apparatus 200. The battery information includes at least information about the full charge capacity of the battery 202. If the battery information is already obtained, the control unit 110 can omit the processing of step S342.

In step S343, the control unit 110 stores information indicating that the electronic apparatus 200 is connected to the connector 103 in the storage unit 111. For example, the control unit 110 sets the value of a connection state flag ConnectionF to "1" and stores the value of ConnectionF in the storage unit 111. If ConnectionF is already 1, the control unit 110 continues to store "1" such that ConnectionF=1.

In step S344, the control unit 110 stores information indicating that the electronic apparatus 200 is not connected to the connector 103 in the storage unit 111. For example, the control unit 110 sets the value of ConnectionF to "0" and stores the value of ConnectionF in the storage unit 111. If ConnectionF is already 0, the control unit 110 continues to store "0" such that ConnectionF=0.

After the processing of the foregoing step S343 or S344 is ended, the processing proceeds to step S303 of FIG. 3A.

In step S303, the control unit 110 obtains information about the remaining battery level of the battery 102 and stores the information in the storage unit 111. For example, the control unit 110 obtains the information about the remaining battery level of the battery 102 by measuring the voltage of the battery 102 and calculating the remaining battery level from the measured voltage value. However, the method for obtaining the information about the remaining battery level of the battery 102 is not limited thereto. The control unit 110 may directly or indirectly obtain the information about the remaining battery level of the battery 102.

The control unit 110 may obtain the information about the remaining battery level by calculation based on the use time and usage of the battery 102.

In step S304, the control unit 110 determines whether ConnectionF is 1. If ConnectionF is determined to be 1 (YES in step S304), the processing proceeds to step S305. If Connection F is determined to be not 1 but 0 (NO in step S304), the processing proceeds to step S306.

In step S305, the control unit 110 performs remaining battery level conversion processing.

Figure 3D:
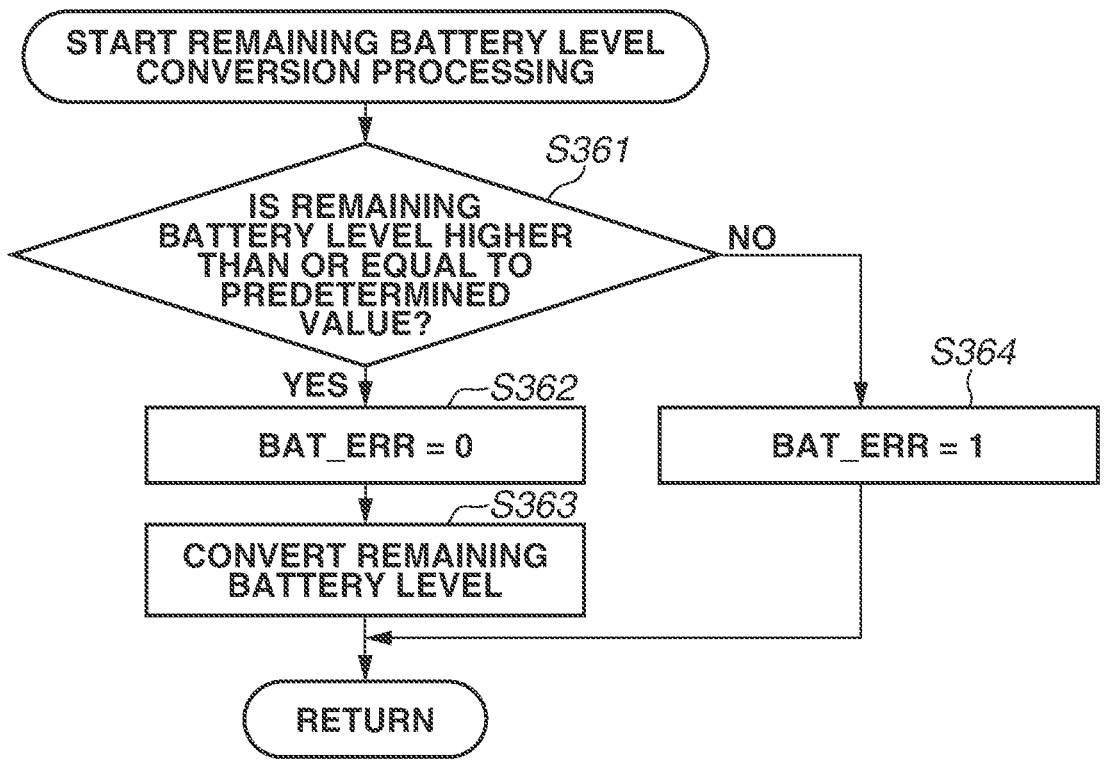

FIG. 3D is a flowchart illustrating an example of the remaining battery level conversion processing performed in step S305.

In step S361, the control unit 110 determines whether the remaining battery level of the battery 102 is higher than or equal to a predetermined value. If the remaining battery level of the battery 102 is determined to be higher than or equal to the predetermined value (YES in step S361), the processing proceeds to step S362. If the remaining battery level of the battery 102 is determined to be not higher than or equal to the predetermined value (NO in step S361), the processing proceeds to step S364. Information about the predetermined value is stored in the storage unit 111 in advance. The predetermined value is set to a value such that the remaining battery level immediately becomes zero if the electronic apparatus 200 is powered by the battery 102.

In step S362, the control unit 110 stores information indicating that the remaining battery level of the battery 102 is sufficient in the storage unit 111. For example, the control unit 110 sets the value of a remaining battery level error flag BAT_ERR to "0" and stores the value of BAT_ERR in the storage unit 111. If BAT_ERR is already 0, the control unit 110 continues to store "0" such that BAT_ERR=0.

In step S363, the control unit 110 calculates how many batteries 202 the remaining battery level of the battery 102 corresponds to. For example, the control unit 110 can calculate the number of batteries, N, by dividing the remaining battery level of the battery 102 obtained in step S303 by the full charge capacity of the battery 202 obtained in step S342. For example, the number N is calculated by using the following equation:

Number $N$=the remaining battery level of the battery 102/the full charge capacity of the battery 202.

If the value N obtained by dividing the remaining battery level of the battery 102 by the full charge capacity of the battery 202 includes a decimal part after the decimal point, the control unit 110 substitutes the integral part before the decimal point into I, substitutes the decimal part after the decimal point into D, and stores I and D in the storage unit 111. For example, if N=3.5, the integral part 3 is substituted into I and the decimal part, 0.5, into D, and I and D are stored. For example, if N=0.5, the integral part, 0, is substituted into I and the decimal part, 0.5, into D, and I and D are stored. Alternatively, the control unit 110 may round up or down the fraction part of the number N after the decimal point to use only the integral part. For example in N=0.5, if the fraction part after the decimal point is rounded up, the resulting integral part, 1, is substituted into I and stored. If the decimal part after the decimal point is rounded down, the resulting integral part, 0, is substituted into I and stored.

In step S364, the control unit 110 stores information indicating that the remaining battery level of the battery 102 is insufficient in the storage unit 111. For example, the control unit 110 sets the value of the remaining battery level error flag BAT_ERR to "1" and stores the value of BAT_ERR in the storage unit 111. If BAT_ERR is already 1, the control unit 110 continues to store "1" such that BAT_ERR=1. The initial value of BAT_ERR is 0.

After the processing of the foregoing step S363 or S364 is ended, the processing proceeds to step S306 of FIG. 3A.

In step S306, the control unit 110 determines whether a predetermined condition is satisfied. If the predetermined condition is determined to be satisfied (YES in step S306), the processing proceeds to S307. If the predetermined condition is determined to be not satisfied (NO in step S306), the processing returns to step S301. The predetermined condition is satisfied if the electronic apparatus 200 is connected to the connector 103 or the power switch 106 is on. In other words, if ConnectionF is 1 or the power switch 106 is on, the processing proceeds to step S307. If ConnectionF is 0 and the power switch 106 is off, the processing returns to step S301.

In step S307, the control unit 110 determines whether the remaining battery level of the battery 102 is sufficient. If the remaining battery level of the battery 102 is determined to be insufficient (NO in step S307), the processing proceeds to step S308. If the remaining battery level of the battery 102 is determined to be sufficient (YES in step S307), the processing proceeds to step S310. For example, if the value of the remaining battery level error flag BAT_ERR is 0, the control unit 110 determines that the remaining battery level of the battery 102 is sufficient. If the value of BAT_ERR is 1, the control unit 110 determines that the remaining battery level of the battery 102 is insufficient.

In step S308, the control unit 110 gives an error display indicating that the remaining battery level of the battery 102 is insufficient on the display unit 101. For example, the control unit 110 displays an image or message indicating that the battery 102 is dead on the display unit 101.

In step S309, the control unit 110 performs error processing. An example of the error processing is processing for prompting the user to charge the battery 102 by using power from the power source. After the end of the error processing, the processing returns to step S301.

In step S310, the control unit 110 displays the remaining battery level of the battery 102 on the display unit 101. Here, the control unit 110 displays the remaining battery level in respectively different display modes when the electronic apparatus 200 is connected to the connector 103 and when the electronic apparatus 200 is not connected to the connector 103. In a case where the electronic apparatus 200 is connected to the connector 103, the control unit 110 displays information indicating the result obtained by calculating the remaining battery level of the battery 102 based on the full charge capacity of the battery 202. In a case where the electronic apparatus 200 is not connected to the connector 103, the control unit 110 displays the ratio of the remaining battery level of the battery 102 to the full charge capacity of the battery 102 in a manner recognizable to the user.

FIGS. 4A to 4D illustrate display examples of the remaining battery level of the battery 102 in a case where the battery device 100 is connected to the electronic apparatus 200 and the battery 102 is used as the power supply of the electronic apparatus 200.

FIG. 4A illustrates a power supply state where the electronic apparatus 200 starts to be powered by the battery 102. The display unit 201 displays a battery image 401 and an "EXT" mark 402 indicating that the electronic apparatus 200 is being powered by the battery device 100. The battery image 401 displays the remaining battery level of the battery 202. The battery image 401 will be described with reference to FIG. 1. The battery image 401 includes a plurality of (in this example, four) rectangular blocks 403 arranged inside. Each block 403 represents a unit of the full charge capacity of the battery 202. Each block 403 is displayed either in black or in white inside. For example, a black block 403 indicates the presence of a remaining battery level equivalent to a capacity as much as one block 403. A white block 403 indicates the absence of a remaining battery level equivalent to a capacity as much as one block 403. All the blocks 403 of the battery images 401 illustrated in FIGS. 1 and 4A are black, which indicates that the remaining battery level of the battery 202 is equivalent to the full charge capacity of the battery 202.

The display unit 101 of the battery device 100 displays the information indicating the result obtained by calculating the remaining battery level of the battery 102 based on the full charge capacity of the battery 202. For example, the display unit 101 displays four battery images 411 in a row. In FIG. 4A, the display unit 101 displays an indication that the remaining battery level of the battery 102 corresponds to four batteries 202.

Figure 5A:
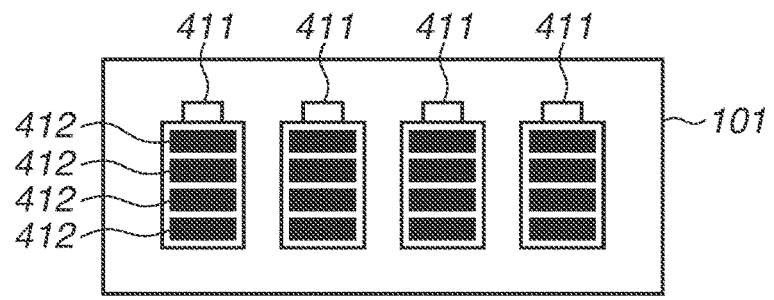
FIGS. 5A to 5F are diagrams illustrating examples of the display mode of the remaining battery level of the battery.

FIG. 5A is an enlarged view of the display unit 101 illustrated in FIG. 4A. FIG. 5A illustrates four battery images 411 on an enlarged scale. The battery images 411 illustrated in FIG. 5A each include a plurality of (in this example, four) rectangular blocks 412 arranged inside. Each block 412 is displayed either in black or in white inside. For example, one black block 412 in a battery image 411 indicates the presence of a remaining battery level of the battery 102 equivalent to a capacity as much as one block 412. One white block 412 in a battery image 411 indicates the absence of a remaining battery level of the battery 102 equivalent to a capacity as much as one block 412. Each battery image 411 with only black blocks 412 illustrated in FIG. 5A indicates that a remaining battery level of the battery 102 as much as one battery 202. The battery images 411 correspond to battery images indicating a charged state, for example. The battery images 411 correspond to predetermined images or second battery images, for example.

By visually observing four battery images 411 with only black blocks 412 as illustrated in FIG. 5A, the user can find out that the remaining battery level of the battery 102 corresponds to four batteries 202. In FIG. 4A, the display unit 101 thus displays the indication that the remaining battery level of the battery 102 corresponds to four batteries 202.

Processing to be executed by the control unit 110 to display the four battery images 411 illustrated in FIG. 4A on the display unit 101 will be described.

In the foregoing step S363, the control unit 110 calculates how many batteries 202 the remaining battery level of the battery 102 corresponds to. Suppose here that the control unit 110 has already obtained the information about the remaining battery level of the battery 102 and the information about the full charge capacity of the battery 202. The control unit 110 divides the remaining battery level of the battery 102 by the full charge capacity of the battery 202, whereby the number N is calculated to be 4. The control unit 110 substitutes 4 into I representing the integral part, and stores I.

Subsequently, in step S310, the control unit 110 displays four battery images 411 in a row on the display unit 101 based on the value, 4, substituted into I representing the integral part. The storage unit 111 stores image data on battery images in advance. Displaying four battery images 411 in a row on the display unit 101 thus allows the user to find out that the remaining battery level of the battery 102 calculated based on the full charge capacity of the battery 202 corresponds to four batteries 202.

FIG. 4B illustrates a state where some time has passed from the power supply state of FIG. 4A. The display unit 201 displays the same images as in FIG. 4A. The display unit 101 of the battery device 100 displays two battery images 411 and one battery image 413.

Figure 5B:
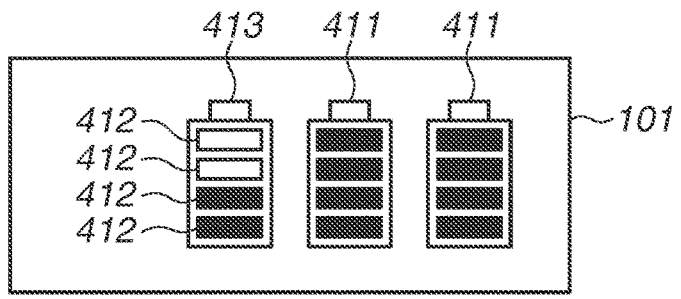

FIG. 5B is an enlarged view of the display unit 101 illustrated in FIG. 4B. FIG. 5B illustrates two battery images 411 and one battery image 413 on an enlarged scale.

The battery images 411 illustrated in FIG. 5B are the same images as those illustrated in FIG. 5A. The battery image 413 illustrated in FIG. 5B includes a plurality of (in this example, four) rectangular blocks 412 arranged inside. Of the four blocks 412, the first and second blocks 412 from the bottom are in black, and the third and fourth blocks 412 from the bottom are in white. A battery image 413 including both black and white blocks 412 represents a unit of the remaining battery level of the battery 102 less than one battery 202. The battery image 413 corresponds to a battery image indicating a partly charged state, for example. The battery image 413 corresponds to a predetermined image or first battery image, for example.

By visually observing two battery images 411 and one battery image 413 as illustrated in FIG. 5B, the user can find out that the remaining battery level of the battery 102 is more than or equal to two batteries 202 but less than three batteries 202. In FIG. 4B, the display unit 101 thus displays an indication that the remaining battery level of the battery 102 is more than or equal to two batteries 202 but less than three batteries 202.

Processing to be executed by the control unit 110 to display two battery images 411 and one battery image 413 as illustrated in FIG. 4B on the display unit 101 will be described. A description of processing similar to that described with reference to FIG. 4A will be omitted.

In the foregoing step S363, the control unit 110 divides the remaining battery level of the battery 102 by the full charge capacity of the battery 202, whereby the number N is calculated to be 2.5. The control unit 110 substitutes 2 into I representing the integral part, substitutes 0.5 into D representing the decimal part, and stores I and D.

In step S310, the control unit 110 displays two battery images 411 in a row on the display unit 101 based on the value, 2, substituted into I representing the integral part. The control unit 110 then determines the number of black blocks 412 among the blocks 412 of the battery image 413 based on the value of D representing the decimal part. The greater the decimal part (the value of D) is, the more black blocks 412 the control unit 110 displays among the blocks 412 of the battery image 413. Specifically, if $0<D\leq0.3$, the control unit 110 displays only the first block 412 from the bottom (from one end) in black and the other blocks 412 in white. If $0.3<D\leq0.6$, the control unit 110 displays the first and second blocks 412 from the bottom in black and the other blocks 412 in white. If $0.6<D<1.0$, the control unit 110 displays the first to third blocks 412 from the bottom in black and the other block 412 in white. The divisions $0<D\leq0.3$, $0.3<D\leq0.6$, and $0.6<D<1.0$ are just examples, and the control unit 110 can change the boundary values. The control unit 110 can also change the boundary values depending on the number of blocks 412 arranged inside the battery image 413.

Displaying two battery images 411 and one battery image 413 on the display unit 101 thus allows the user to find out that the remaining battery level of the battery 102 calculated based on the full charge capacity of the battery 202 is more than or equal to two batteries 202 but less than three batteries 202. The display unit 101 displays the battery image 413 if the remaining battery level of the battery 102 is unable to be represented by an integral number of batteries 202.

FIG. 4C illustrates a state where some time has passed from the power supply state of FIG. 4B. The display unit 201 displays the same images as in FIG. 4A. The display unit 101 of the battery device 100 displays a battery image 413.

Figure 5C:
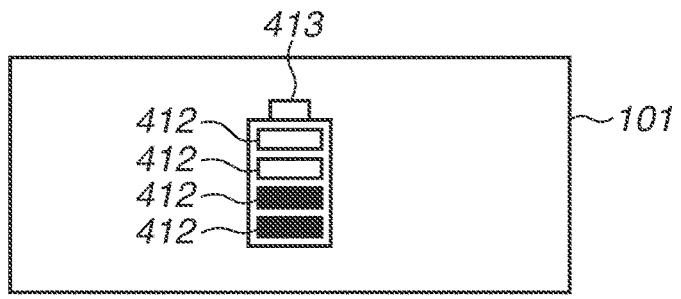

FIG. 5C is an enlarged view of the display unit 101 illustrated in FIG. 4C. FIG. 5C illustrates one battery image 413 on an enlarged scale. The battery image 413 illustrated in FIG. 5C is the same image as that illustrated in FIG. 5B, and represents a unit of the remaining battery level of the battery 102 less than one battery 202.

By visually observing one battery image 413 in FIG. 5C, the user can find out that the remaining battery level of the battery 102 is less than one battery 202. In FIG. 4C, the display unit 101 thus displays an indication that the remaining battery level of the battery 102 is less than one battery 202.

Processing to be executed by the control unit 110 to display the battery image 413 illustrated in FIG. 4C on the display unit 101 will be described. A description of processing similar to that described with reference to FIG. 4A will be omitted.

In the foregoing step S363, the control unit 110 divides the remaining battery level of the battery 102 by the full charge capacity of the battery 202, whereby the number N is calculated to be 0.5. The control unit 110 substitutes 0 into I representing the integral part, substitutes 0.5 into D representing the decimal part, and stores I and D.

In step S310, the control unit 110 displays no battery image 411, based on the value, 0, substituted into I representing the integral part. The control unit 110 displays the first and second blocks 412 from the bottom among the blocks 412 of the battery image 413 in black and the other blocks 412 in white based on the value, 0.5, substituted into D representing the decimal part.

The user can thus find out that the remaining battery level of the battery 102 calculated based on the full charge capacity of the battery 202 is less than one battery 202. The user can also find out from the battery image 413 that the remaining battery level is equivalent to approximately one half of the battery 202.

FIG. 4D illustrates a state where some time has passed from the power supply state of FIG. 4C. The display unit 201 displays a battery image 404 and the "EXT" mark 402. The battery image 404 is displayed without any black block. The battery image 404 indicates that the battery 202 is dead. The display unit 101 of the battery device 100 displays the battery image 414 with no black block since the remaining battery level of the battery 102 is not higher than or equal to a predetermined value. The display unit 101 further blinks the battery image 414 to prompt the user to charge the battery 102.

Processing to be executed by the control unit 110 to display the battery image 414 illustrated in FIG. 4D on the display unit 101 will be described.

In the foregoing step S361, the control unit 110 determines whether the remaining battery level of the battery 102 is higher than or equal to the predetermined value. Here, the control unit 110 determines that the remaining battery level of the battery 102 is not higher than or equal to the predetermined value (NO in step S361), and the processing proceeds to step S364. In step S364, the control unit 110 sets the remaining battery level error flag BAT_ERR to 1 and stores BAT_ERR in the storage unit 111.

Subsequently, in step S307, the control unit 110 determines whether the remaining battery level of the battery 102 is sufficient. Since BAT_ERR is 1, the control unit 110 determines that the remaining battery level is insufficient (NO in step S307), and the processing proceeds to step S308.

In step S308, the control unit 110 displays the battery image 414 on the display unit 101 as an error display indicating that the remaining battery level of the battery 102 is insufficient.

In step S309, the control unit 110 blinks the battery image 414 as the error processing, thereby prompting the user to charge the battery 102 by using power from a power source.

Displaying the battery image 414 on the display unit 101 thus allows the user to find out that the battery 102 needs to be charged.

FIGS. 4E to 4H illustrate display examples of the remaining battery level in a case where the electronic apparatus 200 is connected to the connector 103 and the battery 202 is charged with the power from the battery 102.

FIG. 4E illustrates a charging state where the battery 202 starts to be charged with the power from the battery 102. The display unit 201 displays a battery image 405 and a "CHARGE" mark 406 indicating that the battery 202 is being charged. All the four blocks of the battery image 404 are in white, which indicates that the battery 202 is dead.

The display unit 101 of the battery device 100 displays information indicating the result obtained by calculating the remaining battery level of the battery 102 based on the full charge capacity of the battery 202. For example, the display unit 101 displays four battery images 411 in a row. An enlarged view of the display unit 101 illustrated in FIG. 4E is the same as FIG. 5A. In FIG. 4E, the display unit 101 displays an indication that the remaining battery level of the battery 102 corresponds to four batteries 202. Displaying four batteries 411 in a row on the display unit 101 thus allows the user to find out that the remaining battery level of the battery 102 calculated based on the full charge capacity of the battery 202 corresponds to four batteries 202. In other words, the user can find out that the remaining battery level of the battery 102 can charge the battery 202 four times.

FIG. 4F illustrates a state where some time has passed from the charging state of FIG. 4E. The display unit 201 illustrates a battery image 407. In the battery image 407, two of the white blocks illustrated in FIG. 4E are changed to be black. By visually observing the battery image 407 illustrated in FIG. 4F, the user can find out that the battery 202 has been charged up to approximately one half its capacity from the dead state. The display unit 101 of the battery device 100 displays three battery images 411 and one battery image 413.

Figure 5D:
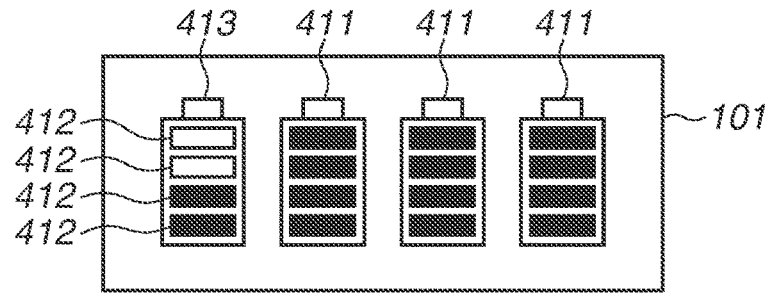

FIG. 5D is an enlarged view of the display unit 101 illustrated in FIG. 4F. FIG. 5D illustrates three battery images 411 and a battery image 413 on an enlarged scale. The battery images 411 illustrated in FIG. 5D are the same images as those illustrated in FIG. 5A. The battery image 413 illustrated in FIG. 5D is the same as the image illustrated in FIG. 5B. A comparison between FIGS. 5A and 5D shows that one of the four battery images 411 illustrated in FIG. 5A is replaced with the battery image 413 illustrated in FIG. 5D. By visually observing the battery image 413 with two white blocks 412 illustrated in FIG. 5D, the user can find out that the remaining battery level of the battery 102 has decreased from the level in the state illustrated in FIG. 5A.

FIG. 4G illustrates a state where some time has passed from the charging state of FIG. 4F. The display unit 201 displays a battery image 408. In the battery image 408, one of the white blocks in FIG. 4F is changed to be black. By visually observing the battery image 408 illustrated in FIG. 4G, the user can find out that the battery 202 charged to approximately one half of the capacity in the state illustrated in FIG. 4F has been further charged up to approximately ¾. The display unit 101 of the battery device 100 displays three battery images 411 and one battery image 415.

Figure 5E:
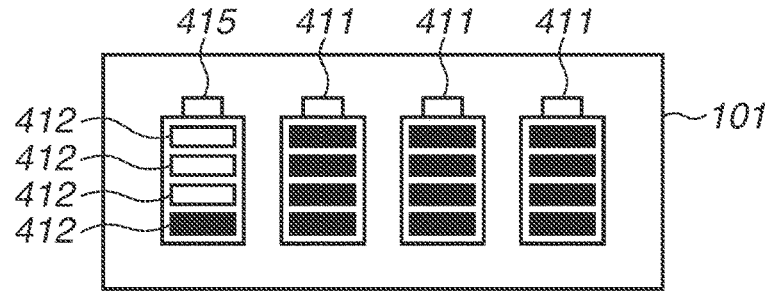

FIG. 5E is an enlarged view of the display unit 101 illustrated in FIG. 4G. FIG. 5E illustrates three battery images 411 and one battery image 415 on an enlarged scale. The battery images 411 illustrated in FIG. 5E are the same images as those illustrated in FIG. 5A. Of the four blocks 412 of the battery image 415 illustrated in FIG. 5E, the first block 412 from the bottom is in black, and the second to fourth blocks 412 from the bottom are in white. The battery image 415 illustrated in FIG. 5E represents a unit of the remaining battery level of the battery 102 less than one battery 202. A comparison between FIGS. 5D and 5E shows that the battery image 413 illustrated in FIG. 5D is replaced with the battery image 415 illustrated in FIG. 5E. By visually observing the battery image 415 with three white blocks 412 illustrated in FIG. 5E, the user can find out that the remaining battery level of the battery 102 has decreased from the level in the state illustrated in FIG. 5D.

FIG. 4H illustrates a state where some time has passed from the charging state of FIG. 4G. The display unit 201 displays the battery image 401 on an enlarged scale. The display unit 201 hides the "CHARGE" mark 406 since the charging of the battery 202 is completed. The white block in the state of FIG. 4G is changed into black so that all the blocks are in black in the battery image 401. By visually observing the battery image 401 illustrated in FIG. 4H, the user can find out that the battery 202 is fully charged. The display unit 101 of the battery device 100 displays three battery images 411.

Figure 5F:
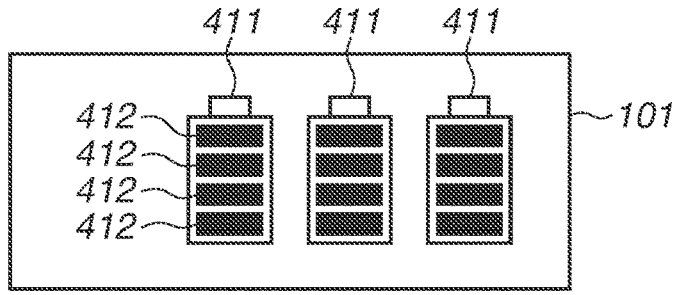

FIG. 5F is an enlarged view of the display unit 101 illustrated in FIG. 4H. FIG. 5F illustrates three battery images 411 on an enlarged scale. The battery images 411 illustrated in FIG. 5F are the same images as those illustrated in FIG. 5A. A comparison between FIGS. 5E and 5F shows that the battery image 415 illustrated in FIG. 5E is not displayed in FIG. 5F. By visually observing the three battery images 411 illustrated in FIG. 5F, the user can find out that the remaining battery level of the battery 102 has decreased from the level in the state illustrated in FIG. 5E. By visually observing the three battery images 411 illustrated in FIG. 5F, the user can also find out that the remaining battery level of the battery 102 calculated based on the full charge capacity of the battery 202 corresponds to three batteries 202.

FIGS. 4I to 4L illustrate display examples of the remaining battery level in a case where the electronic apparatus 200 is not connected to the connector 103 and the battery 102 is charged with power from a power source.

FIG. 4I illustrates a state where the battery 102 starts to be charged with power from a power source connected to the connector 104. The light-emitting unit 105 is lit, whereby the user can find out that the battery 102 is being charged. The display unit 101 of the battery device 100 displays the ratio of the remaining battery level of the battery 102 to the full charge capacity of the battery 102 in percentages. Since the remaining battery level of the battery 102 here is zero, the display unit 101 displays an indication that the remaining battery level of the battery 102 is 0%.

Processing to be executed by the control unit 110 to display the remaining battery level of the battery 102 as illustrated in FIG. 4I will be described.

In the foregoing step S341, the control unit 110 determines whether the electronic apparatus 200 is connected to the connector 103. Here, the control unit 110 determines that the electronic apparatus 200 is not connected to the connector 103 (NO in step S341), and the processing proceeds to step S344. In step S344, the control unit 110 sets the connection state flag ConnectionF to 0 and stores ConnectionF in the storage unit 111.

Subsequently, since ConnectionF is not 1 in step S304 (NO in step S304), the remaining battery level conversion processing of step S305 is omitted and the processing proceeds to step S306. If the electronic apparatus 200 is not connected to the connector 103, the remaining battery level conversion processing is thus omitted and the control unit 110 does not calculate how many batteries 202 the remaining battery level of the battery 102 corresponds to.

Subsequently, in step S310, the control unit 110 displays the remaining battery level of the battery 102 obtained in step S303 on the display unit 101. For example, the control unit 110 divides the remaining battery level of the battery 102 by the full charge capacity of the battery 102, multiplies the quotient by 100, and displays the resulting value on the display unit 101. This allows the user to find out how high the remaining battery level of the battery 102 is with respect to the full charge capacity of the battery 102.

FIG. 4J illustrates a state where some time has passed from the charging state of FIG. 4I. In FIG. 4J, the display unit 101 displays an indication that the remaining battery level of the battery 102 is 10% with respect to the full charge capacity of the battery 102.

FIG. 4K illustrates a state where some time has passed from the charging state of FIG. 4J. In FIG. 4K, the display unit 101 displays an indication that the remaining battery level of the battery 102 is 25% with respect to the full charge capacity of the battery 102.

FIG. 4L illustrates a state where some time has passed from the charging state of FIG. 4K. In FIG. 4L, the display unit 101 displays an indication that the remaining battery level of the battery 102 is 100% with respect to the full charge capacity of the battery 102, i.e., that the battery 102 is charged up to its full charge capacity. In addition, the light-emitting unit 105 is lit off, whereby the user can find out that the charging of the battery 102 is completed.

After the remaining battery level of the battery 102 is thus displayed in step S310, the processing returns to step S301.

As described above, according to the first exemplary embodiment, the display unit 101 of the battery device 100 can display the information indicating the result obtained by calculating the remaining battery level of the battery 102 based on the full charge capacity of the battery 202. The user can thus find out the remaining battery level of the battery 102.

According to the first exemplary embodiment, the battery 102 serves as a power supply for charging the battery 202 of the electronic apparatus 200 or a power supply for powering the electronic apparatus 200. If the electronic apparatus 200 is powered by the battery 102, the user can thus intuitively find out how many batteries 202 of the electronic apparatus 200 can be charged or as much as how many batteries 202 the electronic apparatus 200 can be powered.

According to the first exemplary embodiment, the display unit 101 can display the information indicating the result obtained by calculating the remaining battery level of the battery 102 based on the full charge capacity of the battery 202 in response to the connection of the electronic apparatus 200 to the connector 103. The user can find out that the display of the remaining battery level of the battery 102 relates to the battery 202.

<First Modification>

In the foregoing first exemplary embodiment, as illustrated in FIG. 5A, the description has been given of an example in which the display unit 101 displays four battery images 411 if the remaining battery level of the battery 102 corresponds to four batteries 202. However, this is not restrictive.

Figure 6A:
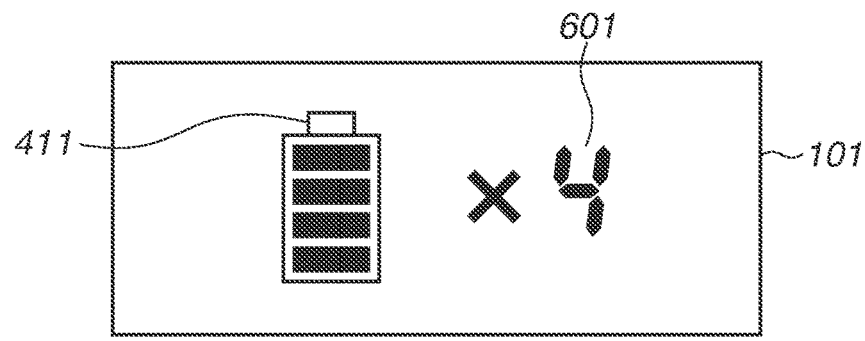
FIGS. 6A to 6E are diagrams illustrating modifications of the display mode of the remaining battery level of the battery.

A first modification of the first exemplary embodiment will be described with reference to FIG. 6A. As illustrated in FIG. 6A, the display unit 101 displays a battery image 411 and a "x number" 601 in combination. According to the display example illustrated in FIG. 6A, the user can find out that four batteries 202 can be charged or power equivalent to four batteries 202 can be supplied.

To implement the display example illustrated in FIG. 6A, in step S310, the control unit 110 displays the battery image 411 on the display unit 101, and numerically displays the value substituted into I representing the integral part of the value N calculated in step S363 on the display unit 101. If the calculated value N includes a decimal part (value D), the control unit 110 can round up or down the fraction part after the decimal point to display only the integral part.

<Second Modification>

Figure 6B:
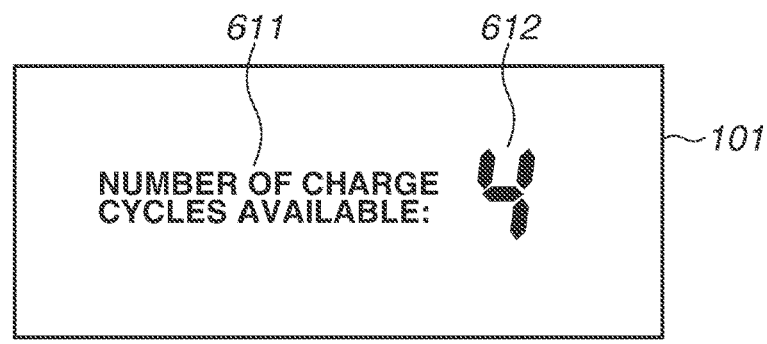

A second modification of the first exemplary embodiment will be described with reference to FIG. 6B. As illustrated in FIG. 6B, the display unit 101 displays characters 611 "NUMBER OF CHARGE CYCLES AVAILABLE:" and a numeral 612 in combination. According to the display example illustrated in FIG. 6B, the user can find out that the battery 202 can be charged four times.

To implement the display example illustrated in FIG. 6B, in step S310, the control unit 110 displays the characters 611 "NUMBER OF CHARGE CYCLES AVAILABLE:" on the display unit 101. In addition, the control unit 110 numerically displays the value substituted into I representing the integral part of the value N calculated in step S363 on the display unit 101. If the calculated value N includes a decimal part (value D), the control unit 110 may display the fraction part after the decimal point as well. The control unit 110 may round up or down the fraction part after the decimal point to display only the integral part.

<Third Modification>

In the foregoing first exemplary embodiment, as illustrated in FIG. 5B, the description has been given of an example in which the battery images 411 and 413 including a plurality of blocks 412 arranged inside are displayed. However, this is not restrictive.

Figure 6C:
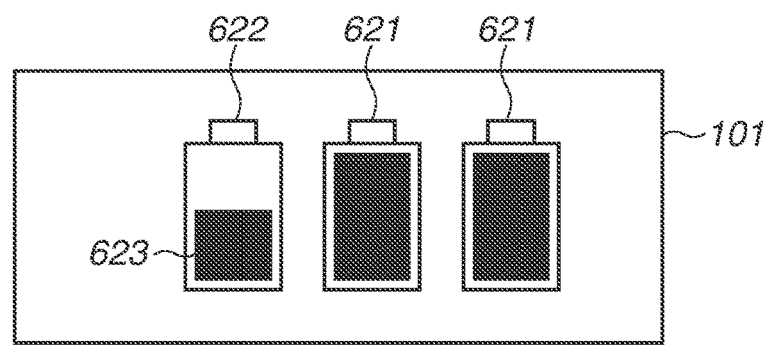

A third modification of the first exemplary embodiment will be described with reference to FIG. 6C. As illustrated in FIG. 6C, the display unit 101 displays battery images 621 and a battery image 622 that do not include an array of blocks. Here, two battery images 621 and one battery image 622 are displayed. The battery images 621 are black inside. The battery images 621 illustrated in FIG. 6C replace the battery images 411 illustrated in FIG. 5A. Each battery image 621 indicates that a remaining battery level of the battery 102 is equivalent to one battery 202. The battery image 622 is partly black and partly white inside. The battery image 622 illustrated in FIG. 6C replaces the battery image 413 illustrated in FIG. 5B. The larger a black occupied area 623 of the battery image 622 is, the higher the remaining battery level of the battery 102 is indicated to be. The display unit 101 displays the black occupied area 623 while changing its size continuously or in steps more than the number of blocks 412 in the battery image 413. According to the display example illustrated in FIG. 6C, the user can find out the remaining battery level of the battery 102 by visually observing the size of the occupied area 623 in the battery image 622.

To implement the display example illustrated in FIG. 6C, in step S310, the control unit 110 displays two battery images 621 in a row on the display unit 101 based on the value, 2, substituted into I representing the integral part stored in the storage unit 111. The control unit 110 then determines the size of the black occupied area 623 in the battery image 622 based on the value substituted into D representing the decimal part stored in the storage unit 111. The greater the decimal part (the value of D) is, the larger black occupied area 623 the control unit 110 displays. The smaller the decimal part (the value of D) is, the smaller black occupied area 623 the control unit 110 displays. Based on a value of, e.g., 0.5 substituted into D representing the decimal part, the control unit 110 displays a black occupied area 623 having a size corresponding to approximately one half the entire area inside the battery image 622 on the display unit 101.

<Fourth Modification>

In the foregoing first exemplary embodiment, as illustrated in FIGS. 4I to 4L, the description has been given of an example in which the display unit 101 displays the ratio of the remaining battery level of the battery 102 to the full charge capacity of the battery 102 in percentages if the electronic apparatus 200 is not connected to the connector 103.

Figure 6D:
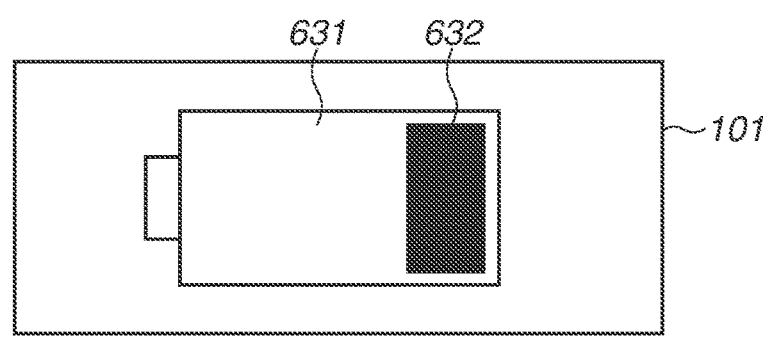

A fourth modification of the first exemplary embodiment will be described with reference to FIG. 6D. As illustrated in FIG. 6D, the display unit 101 displays the remaining battery level of the battery 102 in terms of the size of a black occupied area 632 in a battery image 631. The larger the black occupied area 632 of the battery image 631 is, the higher the remaining battery level of the battery 102 is. The display unit 101 displays the black occupied area 632 while changing its size continuously or in steps more than the number of blocks 412 in the battery image 413. The battery image 631 illustrated in FIG. 6D is different in size from the battery images 411 illustrated in FIG. 5A, for example. Displaying different battery images allows the user to find out which of the following is being displayed: how many batteries 202 the remaining battery level of the battery 102 corresponds to or a percentage of the remaining battery level of the battery 102 relative to the full charge capacity of the battery 102. The battery image 631 corresponds to a third battery image, for example. The battery image 631 illustrated in FIG. 6D and the battery images 411 illustrated in FIG. 5A may be any battery images that the user can identify as being different. The battery image 631 illustrated in FIG. 6D and the battery images 411 illustrated in FIG. 5A can be different in at least any one of size, shape, and color.

To implement the display example illustrated in FIG. 6D, in step S310, the control unit 110 divides the remaining battery level of the battery 102 obtained in step S303 by the full charge capacity of the battery 102, multiplies the quotient by 100, and determines the size of the occupied area 632 based on the resulting value. The greater the value is, the larger black occupied area 632 the control unit 110 displays. The smaller the value is, on the other hand, the smaller black occupied area 632 the control unit 110 displays. For example, if the value is 25, the control unit 110 displays as large a black occupied area 632 as 25% of the entire area of the battery image 631 on the display unit 101.

<Fifth Modification>

In the foregoing first exemplary embodiment, the description has been given of an example in which the display unit 101 reduces the number of displayed battery images in changing the display from four battery images 411 as illustrated in FIG. 4A to two battery images 411 and one battery image 413 as illustrated in FIG. 4B. However, this is not restrictive.

Figure 6E:
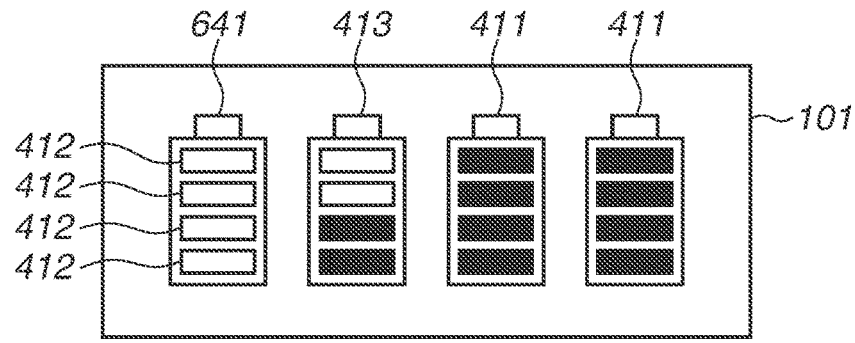

A fifth modification of the first exemplary embodiment will be described with reference to FIG. 6E. As illustrated in FIG. 6E, the display unit 101 displays battery images 641, 413, and 411. Here, one battery image 641, one battery image 413, and two battery images 411 are displayed. The battery images 411 illustrated in FIG. 6E are the same as those images illustrated in FIG. 5A. The battery image 413 illustrated in FIG. 6E is the same as the image illustrated in FIG. 5B. The battery image 641 illustrated in FIG. 6E includes a plurality of (in this example, four) rectangular blocks 412 arranged inside, and all the blocks 412 are in white. One battery image (empty battery image) 641 with only white blocks 412 indicates that the remaining battery level of the battery 102 has decreased by the amount of charge corresponding to one battery 202. A battery image 411 corresponds to one group, and a battery image 641 corresponds to another group. According to the display example illustrated in FIG. 6E, the user can find out that, if the battery 102 is charged up to its full charge capacity, the remaining battery level of the battery 102 calculated based on the full charge capacity of the battery 202 corresponds to four batteries 202.

To implement the display example illustrated in FIG. 6E, in step S363, the control unit 110 displays two battery images 411 in a row on the display unit 101 based on the value, 2, substituted into I representing the integral part. Next, based on a value of, e.g., 0.5 substituted into D representing the decimal part, the control unit 110 displays the first and second blocks 412 from the bottom among the blocks 412 of the battery image 413 in black, and the other blocks 412 in white. The control unit 110 then displays the empty battery image 641 as the remaining one battery image.

Another method in which the control unit 110 displays the empty battery image 641 will be described. The control unit 110 calculates how many batteries 202 the full charge capacity of the battery 102 corresponds to in advance according to the following equation:

$$N\text{max} = \text{the full charge capacity of the battery 102/the full charge capacity of the battery 202.}$$

Nmax is a value indicating how many batteries 202 the full charge capacity of the battery 102 corresponds to. If the calculated value Nmax includes a decimal part, the control unit 110 may round up or down the fraction part after the decimal point to use only the integral part.

The control unit 110 can then subtract N from Nmax and display an empty battery image or images 641 based on the value of the integral part of the difference. For example, if Nmax is 4 and N is 1.5, two empty battery images 641 are displayed based on the value, 2, of the integral part of the value, 2.5, obtain by subtracting 1.5 from 4.

Part or all of the functions, processing, and methods described in the foregoing exemplary embodiments and modifications may be implemented by a personal computer, a microcomputer, or a central processing unit (CPU) executing a program. In a second exemplary embodiment, the personal computer, microcomputer, or CPU will be referred to as a "computer X". In the second exemplary embodiment, a program for controlling the computer X and implementing part or all of the functions, processing, and methods described in the foregoing exemplary embodiments and modifications will be referred to as a "program Y".

Part or all of the functions, processing, and methods described in the foregoing exemplary embodiments and modifications are implemented by the computer X executing the program Y. In such a case, the program Y is supplied to the computer X via a computer-readable storage medium. Examples of the computer-readable storage medium according to the second exemplary embodiment include at least one of the following: a hard disk drive, a magnetic recording device, an optical recording device, a magneto-optic recording device, a memory card, a volatile memory, and a non-volatile memory. The computer-readable storage medium according to the second exemplary embodiment is a non-transitory storage medium.

Other Exemplary Embodiments

In the foregoing exemplary embodiments and modifications, being charged with electricity is indicated by black in the battery images, and not being charged with electricity is indicated by white in the battery images. However, this is not restrictive. Whether being charged or not can be indicated by colors other than black and white, or by different shapes or patterns, as long as the user can identify it.

In the foregoing exemplary embodiments and modifications, the battery device 100 has been described to be a device operating as a mobile battery. However, this is not restrictive. The battery device 100 may be a smartphone or a tablet terminal.

In the foregoing exemplary embodiments and modifications, the electronic apparatus 200 has been described to be an apparatus operating as a digital camera. However, this is not restrictive. The electronic apparatus 200 may be a smartphone or a tablet terminal.

In the foregoing exemplary embodiments, the battery device 100 and the electronic apparatus 200 have been described to be connected in a wired manner. However, this is not restrictive. The battery device 100 may be configured to wirelessly supply power to the electronic apparatus 200.

While aspects of the disclosure are described with reference to exemplary embodiments, it is to be understood that the aspects of the disclosure are not limited to the exemplary embodiments. The scope of the following claims is to be accorded the broadest interpretation so as to encompass all such modifications and equivalent structures.

This application claims the benefit of Japanese Patent Application No. 2020-007860, filed Jan. 21, 2020, which is hereby incorporated by reference herein in its entirety.

What is claimed is:
1. A battery device comprising:
a connector to which an electronic apparatus is connected;
a display;
a CPU; and
a memory which stores a program which, when executed by the CPU, causes the battery device to function as:
a communication unit configured to communicate with the electronic apparatus connected to the connector via the connector,
wherein the communication unit receives information about a full charge capacity of a battery of the electronic apparatus from the electronic apparatus connected to the connector via the connector;
a calculation unit configured to calculate a remaining battery level of a battery of the battery device based on the information about the full charge capacity of the battery of the electronic apparatus received from the electronic apparatus; and a display control unit configured to display information indicating a result of calculation made by the calculation unit on the display.

2. The battery device according to claim 1, wherein the display control unit is configured to display the information indicating the result of the calculation made by the calculation unit in response to connection of the electronic apparatus to the connector.

3. The battery device according to claim 1, wherein the display control unit is configured to detect whether the electronic apparatus is connected to the connector or not and to change information to be displayed on the display in accordance with the detection result such that, if it is detected that the electronic apparatus is connected to the connection unit, first information indicating the result of the calculation made by the calculation unit is displayed, and if it is detected that the electronic apparatus is not connected to the connection unit, second information, different from the first information, indicating the remaining battery level of the battery of the battery device is displayed.

4. The battery device according to claim 1, wherein the information indicating the result of the calculation made by the calculation unit is information indicating a number of batteries of the electronic apparatus corresponding to the remaining battery level of the battery of the battery device.

5. The battery device according to claim 1, wherein the program, when executed by the CPU, further causes the battery device to function as:

an output unit configured to output power from the battery of the battery device to the electronic apparatus connected to the connector via the connector, and wherein the battery of the electronic apparatus is charged with the power output to the electronic apparatus via the connector.

6. The battery device according to claim 5, wherein the electronic apparatus operates with the power output to the electronic apparatus via the connector in a case where the battery of the battery device is used as a power source of the electronic apparatus.

7. The battery device according to claim 1, wherein the program, when executed by the CPU, further causes the battery device to function as:

a charging unit configured to charge the battery of the battery device with power from an external power source connected to the battery device.

8. A method for controlling a battery device, comprising:

receiving information about a full charge capacity of a battery of an electronic apparatus connected to a connector of the battery device from the electronic apparatus connected to the connector of the battery device via the connector of the battery device;

calculating by a calculation unit of the battery device a remaining battery level of a battery of the battery device based on the information about the full charge capacity of the battery of the electronic apparatus received by the receiving; and displaying information indicating a result of calculation made by the calculation unit on a display of the battery device.

9. The method according to claim 8, wherein the information indicating the result of the calculation made by the calculation unit is displayed in response to connection of the electronic apparatus to the connector.

10. The method according to claim 8, further comprising:

detecting whether the electronic apparatus is connected to the connector or not, wherein the displaying changes information to be displayed on the display in accordance with the detection result such that, if it is detected that the electronic apparatus is connected to the connector, first information indicating the result of the calculation made by the calculation unit is displayed, and if it is detected that the electronic apparatus is not connected to the connector, second information, different from the first information, indicating the remaining battery level of the battery of the battery device is displayed.

11. The method according to claim 8, wherein the information indicating the result of the calculation made by the calculation unit is information indicating a number of batteries of the electronic apparatus corresponding to the remaining battery level of the battery of the battery device.

12. A non-transitory storage medium that stores a program for causing a computer to execute a method for controlling a battery device, the method comprising:

receiving information about a full charge capacity of a battery of an electronic apparatus connected to a connector of the battery device from the electronic apparatus connected to the connector of the battery device via the connector of the battery device;

calculating by a calculation unit of a battery device a remaining battery level of a battery of the battery device based on the information about the full charge capacity of the battery of the electronic apparatus received by the receiving; and displaying information indicating a result of calculation made by the calculation unit on a display unit of the battery device.

* * * * *